United States Patent
Hairston et al.

(10) Patent No.: US 10,992,895 B2
(45) Date of Patent: *Apr. 27, 2021

(54) ROLLING SUBFRAME PULSED BIAS MICROBOLOMETER INTEGRATION

(71) Applicant: BAE Systems Information and Electronic Systems Integration Inc., Nashua, NH (US)

(72) Inventors: Allen W Hairston, Andover, MA (US); Daniel P Lacroix, Westford, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 235 days.

This patent is subject to a terminal disclaimer.

(21) Appl. No.: 15/985,237

(22) Filed: May 21, 2018

(65) Prior Publication Data
US 2019/0356875 A1    Nov. 21, 2019

(51) Int. Cl.
*G01J 5/00* (2006.01)
*H04N 5/378* (2011.01)
*H04N 5/369* (2011.01)
*H01L 27/146* (2006.01)
*H04N 5/33* (2006.01)

(52) U.S. Cl.
CPC ....... *H04N 5/378* (2013.01); *H01L 27/14649* (2013.01); *H04N 5/33* (2013.01); *H04N 5/3698* (2013.01)

(58) Field of Classification Search
CPC ........ H04N 5/378; H04N 5/33; H04N 5/3698; H01L 27/14649; G01J 5/24
USPC .................................................... 250/338.1
See application file for complete search history.

(56) References Cited

U.S. PATENT DOCUMENTS

| | | | | |
|---|---|---|---|---|
| 6,249,002 B1* | 6/2001 | Butler | ....................... | G01J 5/22 250/338.4 |
| 6,274,869 B1* | 8/2001 | Butler | ..................... | G01J 5/061 250/338.1 |
| 6,433,333 B1* | 8/2002 | Howard | ................... | H04N 5/33 250/252.1 |
| 6,791,610 B1* | 9/2004 | Butler | .................. | H04N 5/3651 348/297 |
| 6,891,160 B2* | 5/2005 | Kaufman | ................ | G01J 5/522 250/252.1 |
| 9,787,923 B2* | 10/2017 | Petilli | .................... | H04N 5/3575 |
| 9,918,023 B2* | 3/2018 | Simolon | ............. | H01L 27/1469 |
| 2002/0022938 A1* | 2/2002 | Butler | ................... | H04N 5/3655 702/85 |
| 2003/0213910 A1* | 11/2003 | Anderson | ............ | H04N 5/3651 250/338.1 |
| 2005/0258367 A1* | 11/2005 | Anderson | ................ | H04N 5/33 250/338.1 |

(Continued)

OTHER PUBLICATIONS

International Search Report, PCT/US19/28682, dated Mar. 5, 2020, 14 pages.

*Primary Examiner* — Kiho Kim
(74) *Attorney, Agent, or Firm* — Maine Cernota & Rardin; Scott J. Asmus

(57) ABSTRACT

Methods and systems for enabling an approximation of true snapshot integration by lowering total power requirements, total detector bias current, integrated charge per detector and detector impedance while allowing for higher ROIC input noise through the use of microbolometer photodetectors, super-pixels, and techniques for their use are herein provided.

16 Claims, 5 Drawing Sheets

(56) References Cited

U.S. PATENT DOCUMENTS

| | | | | |
|---|---|---|---|---|
| 2006/0131484 | A1* | 6/2006 | Peting | H04N 5/37455 |
| | | | | 250/214 R |
| 2007/0029484 | A1* | 2/2007 | Anderson | H04N 5/33 |
| | | | | 250/338.1 |
| 2012/0043464 | A1* | 2/2012 | Kryskowski | H04N 5/33 |
| | | | | 250/332 |
| 2014/0138543 | A1* | 5/2014 | LaVeigne | G01J 5/20 |
| | | | | 250/338.1 |
| 2015/0009386 | A1* | 1/2015 | Komaba | H04N 5/369 |
| | | | | 348/308 |
| 2015/0085134 | A1* | 3/2015 | Novotny | G01J 5/24 |
| | | | | 348/164 |
| 2015/0215553 | A1* | 7/2015 | Medeiro Hidalgo | H04N 5/378 |
| | | | | 250/208.1 |
| 2015/0288909 | A1* | 10/2015 | Komaba | H04N 9/04511 |
| | | | | 348/308 |
| 2016/0104696 | A1* | 4/2016 | LaVeigne | H01L 27/14649 |
| | | | | 257/88 |
| 2017/0041571 | A1* | 2/2017 | Tyrrell | H04N 5/37455 |
| 2017/0054922 | A1* | 2/2017 | Novotny | H01L 21/32134 |

\* cited by examiner

ROLLING SUBFRAME PULSED BIAS MICROBOLOMETER INTEGRATION

STATEMENT OF GOVERNMENT INTEREST

This invention was made with government support under contract no. W909MY-18-9-0001 awarded by the United States Army. The government has certain rights in the invention.

FIELD

The disclosure relates to imaging, and, more particularly, to circuits and methods of operating circuits to reduce power and detector impedance requirements for near snapshot integration.

BACKGROUND

Digital detection of visual and infrared (IR) images is a very widely used technology, having applications ranging from consumer-oriented cameras and video apparatuses to law enforcement and military equipment. For virtually all of these applications, there is a growing demand for higher image pixel counts, higher pixel density, increased sensitivity, improved dynamic range, and faster image processing.

In particular, many emerging thermal infrared (IR) sensing applications simultaneously demand high sensitivity, large dynamic range, large pixel count, and operation at fast data rates. Among these applications are day/night persistent surveillance, border patrol and protection, aerial search and rescue, and environmental remote sensing. Such applications require sensor systems capable of high-quality, large-pixel-count images. Organizations such as the US Army Night Vision and Electronic Sensors Directorate (NVESD) are demanding ever higher pixel counts and densities to meet the challenges brought about by such applications.

At the heart of all digital imaging systems is the Focal Plane Array ("FPA"), which is a two-dimensional array of elements upon which an image is focused, whereby each of the FPA elements or "pixels" develops an analog output "signal charge" that is proportional to the intensity of the light that is impinging on it. Traditionally, a readout integrated circuit ("ROIC") uses an integration capacitor to store the signal charge at each pixel of the FPA, and then routes the analog signals onto output taps for readout and digitization by analog-to-digital converters ("ADC's") external to the individual pixels. This approach requires storing a large signal charge at each pixel site, and further requires that an adequate signal-to-noise ratio and dynamic range be maintained as the analog signals are read out and digitized. Accordingly, this traditional approach suffers from sensitivity and dynamic range limitations.

One approach for improving the sensitivity and dynamic range of an imaging system is to include "in-pixel" ADC circuits within the ROIC, whereby a separate digitizing circuit is located proximal to each pixel (or to each localized group of pixels) so that the signal charges for the pixels are digitized before being read out of the ROIC. However, conventional ADC circuits comprise large numbers of flip-flops and other digital elements. As a result, they are bulky, which limits the achievable pixel density.

A more compact in-pixel ADC can be implemented by dedicating a small in-pixel integration capacitor, comparator, and binary digital counter to each pixel (or localized group of pixels). According to this approach, for each pixel, the associated integration capacitor is charged by the signal charge of the pixel, while the comparator monitors the charge of the integration capacitor and issues an output pulse spike that resets the integration capacitor each time the integrated charge reaches a specified threshold value. The comparator thereby issues a train of output pulses, which are counted by the binary digital counter.

The train of pulses from the comparator terminates when the signal charge of the pixel is fully drained by the integration capacitor, or when the measurement ends, such that the number of pulses counted by the counter represents a digital measurement of the amplitude of the signal charge, with the reset threshold value of the comparator representing the least significant bit (LSB) accuracy of the measurement. The total number of spikes is retained by the binary counter until it is read out by the multiplexer of the ROIC. When integration occurs simultaneously across all pixels of the FPA, this is referred to as true snapshot integration.

This in-pixel binary counter approach, which may be referred to as single stage ADC, allows for increased dynamic range, due to the ability to add bits to the binary counter. While this approach is an improvement over earlier methods, in terms of dynamic range, single stage ADC counters must count the full range, one bit at a time, and, in high count rate applications, such a configuration may become a performance bottleneck. Even assuming performance was not limited by the use of a single stage ADC, such a device requires significant amounts of power to assure proper functioning. While these issues might be mitigated through the use of stacked digital layers, this would result in significantly more expensive fabrication and assembly processes. Moving to a smaller geometry (e.g. a 14 nm process) might also mitigate such issues, but would also be very expensive.

An extension of this approach, referred to as two stage ADC, involves digitizing the residue in the integration capacitor after the initial integration is finished to obtain a fine residue value. The fine residue value and coarse counts are then combined to reach a final value, achieving additional accuracy by reducing the value of the LSB. While two stage ADC provides benefits over single stage ADC, including reducing the count rate in coarse mode and operating at a lower power, power requirements, total detector bias current, integrated charge per detector and detector impedance are still too high for true snapshot integration in some applications.

Lastly, ROIC input noise thresholds are currently too low for true snapshot integration in some applications.

What is needed, therefore, are devices and methods that enable true snapshot integration, or an approximation thereof, by lowering total power requirements, total detector bias current, integrated charge per detector and detector impedance while allowing for higher ROIC input noise.

SUMMARY

Rolling subframe pulsed bias integration, as disclosed herein, allows virtually the same performance as true simultaneous snapshot integration while using detector impedances much closer to existing values than would be required if true simultaneous snapshot integration were used. In embodiments, the difference in required detector impedance between true snapshot integration and rolling subframe pulsed bias integration is approximately two orders of magnitude.

Rolling subframe pulsed bias integration in accordance with embodiments of the present disclosure provides such benefits, in part, because it allows a relatively large in-pixel ROIC to operate a group of detectors and share components, by having only one of the detectors in the group integrate at a given time. Although having one ROIC cell integrate different detectors in turn (i.e. act as a shared super-pixel) using a circuit such as that shown in FIG. 1 is not new, combining a shared cell with rolling subframe pulse bias integration techniques and enabling structures differs in that it allows the shared pixels to overlap integrations, minimizing integration skew, the time difference for the average integration time, thereby enabling near true snapshot (i.e. simultaneous or global) integration.

Furthermore, shorter readout integration time, in accordance with embodiments of the present disclosure has many advantages including lower total power, total detector bias current, and integrated charge per detector while allowing higher ROIC input noise and lower detector impedance.

By incorporating microbolometers, which inherently thermally integrate a scene, into such a system, no loss in FPA sensitivity is incurred by having the readout integration be a rolling subframe, compared to continuous, or true snapshot, integration.

Advantages of this approach include a dynamic range limited only by the number of bits in a counter, not by process voltage range, allowing for counter rollover for automatic noiseless offset subtraction, and support for very fast frame rates, even for larger formats, due to the digital output from the pixel.

One embodiment of the present disclosure provides an infrared imaging apparatus comprising: a focal plane array, the focal plan array comprising: a plurality of pixels, wherein the pixels are arranged into groups of equal numbers of pixels, each pixel comprising: a microbolometer configured to receive electromagnetic energy; and a readout integrated circuit configured to perform in-pixel analog to digital conversion, wherein at least a portion of the readout integrated circuit is shared between pixels of a given group.

Another embodiment of the present disclosure provides such an infrared imaging apparatus wherein the readout integrated circuit of each pixel comprises a detector common, a BDI input with low noise bias amp, an integration stop switch, a readout integration capacitor, a comparator with threshold voltage input, a VRSI reference/ramp, an integration reset switch, a count reset connection, an enable count latch, a global clock, a readout connection, a data in bus, a count/shift bus, a counter/shift register, and a data out module.

A further embodiment of the present disclosure provides such an infrared imaging apparatus wherein the readout integrated circuit is configured to perform in-pixel single slope analog to digital conversion.

A further embodiment of the present disclosure provides such an infrared imaging apparatus wherein the readout integrated circuit is configured to perform in-pixel two-stage analog to digital conversion.

One embodiment of the present disclosure provides an infrared imaging apparatus comprising: a plurality of groups of pixels; wherein each pixel in a group of pixels shares a plurality of components with other pixels in the group of pixels, wherein each pixel comprises a microbolometer photodetector, and wherein each of the groups of pixels is configured to perform in-pixel analog to digital conversion of electromagnetic energy collected by the photodetectors within that group of pixels using circuitry common to the group of pixels.

Another embodiment of the present disclosure provides such an infrared imaging apparatus wherein the common circuitry comprises a readout integrated circuit.

A further embodiment of the present disclosure provides such an infrared imaging apparatus wherein the readout integrated circuit common to each grouping of pixels comprises a detector common, a BDI input with low noise bias amp, an integration stop switch, a readout integration capacitor, a comparator with threshold voltage input, a VRSI reference/ramp, an integration reset switch, a count reset connection, an enable count latch, a global clock, a latch connection, a data in bus, a count/shift bus, a charge pump analog multi-value digital counter, and a data out module.

Yet another embodiment of the present disclosure provides such an infrared imaging apparatus wherein the readout integrated circuit common to each grouping of pixels comprises a detector common, a BDI input with low noise bias amp, an integration stop switch, a readout integration capacitor, a comparator with threshold voltage input, a VRSI reference/ramp, an integration reset switch, a count reset connection, an enable count latch, a global clock, a latch connection, a data in bus, a count/shift bus, a counter/latch, and a data out module.

A yet further embodiment of the present disclosure provides such an infrared imaging apparatus further comprising a latch module comprising a select latch write and select latch read, wherein the latch module is in operative communication with the counter/latch.

Still another embodiment of the present disclosure provides such an infrared imaging apparatus further comprising a multiplexer disposed between the microbolometer and the bias amp.

A still further embodiment of the present disclosure provides such an infrared imaging apparatus wherein the readout integrated circuit is configured to perform in-pixel single slope ADC.

Even another embodiment of the present disclosure provides such an infrared imaging apparatus wherein the readout integrated circuit is configured to perform in-pixel two-stage ADC.

One embodiment of the present disclosure provides a rolling subframe pulse bias integration method comprising: on a focal plane array comprising a plurality of pixels, wherein the pixels are grouped into subsets containing equal numbers of pixels, each pixel comprising a microbolometer photodetector: using a readout integrated circuit, integrating one microbolometer from each group of pixels simultaneously; integrating the remaining microbolometers in each group, one at a time, simultaneously with those of all other groups of pixels; summing the results of each integration, thereby providing a total frame integration value for each pixel; and reading the integrated current off of the readout integrated circuit.

Another embodiment of the present disclosure provides such a rolling subframe pulse bias integration method wherein reading the integrated current off of the readout integrated circuit comprises: reading out of coarse data off of the readout integrated circuit; and performing fine conversion of the coarse data.

A further embodiment of the present disclosure provides such a rolling subframe pulse bias integration method further comprising, after performing fine conversion of the coarse data, reading out of the fine data off of the readout integrated circuit.

Yet another embodiment of the present disclosure provides such a rolling subframe pulse bias integration method further comprising repeating the integration of the pixels a plurality of times after each pixel from a group of pixels has been integrated.

A yet further embodiment of the present disclosure provides such a rolling subframe pulse bias integration method wherein integration of one microbolometer from each group of pixels occurs over a small fraction of a portion of a frame dedicated to readout integration.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
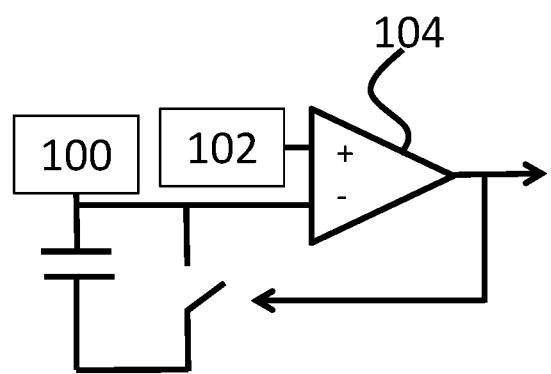
FIG. 1 is a block diagram illustrating a prior art readout integrated circuit.

Where design requirements dictate true snapshot integration, i.e. integration across all detectors simultaneously, a digital pixel solution incorporating circuitry such as that shown in FIG. 1, which includes a detector current input 100, a threshold voltage 102 input to a comparator 104, and other enabling circuitry (e.g. integration capacitor(s) and transistors), can help to make this possible by reducing power and other requirements. Such solutions are insufficient, however, in high resolution, sensitivity, and frame rate applications.

Rolling subframe pulsed bias integration techniques and systems combined with digital pixel technology, in accordance with embodiments of the present disclosure, allow for a close approximation of true snapshot integration. In many cases, they also enable a single layer pixel solution, which is much less expensive to produce, compared to a dual layer design. This cost savings is true for both recurring and non-recurring cases. Furthermore, unlike dual layer designs, such techniques and systems can be implemented in very large area ROICs, using field stitching techniques. Such benefits result, in part, from allowing a relatively large ROIC pixel to operate a group of detectors and share components. This is made possible, in part, by having only one of the detectors in a given group integrating at a given time. While integration subframes are ordinarily used with subframe averager circuits for increased charge capacity, here they are used to spread out and interleave temporal response, lowering the subframe duty cycle and reducing peak integration currents, making them achievable on an ROIC.

Combining a shared cell with rolling subframe pulse bias integration techniques allows the shared pixels to overlap integrations, minimizing integration skew, the time difference for the average integration time, thereby enabling near true snapshot (i.e. simultaneous or global) integration. Shorter readout integration 200 times that result from the use of such techniques and systems also result in lower total power, total detector bias current, detector impedance, and integrated charge per detector while allowing higher ROIC input noise. These benefits allow for higher frame rates and resolutions.

In embodiments, a microbolometer 312 photodetector is used in combination with such systems and methods. A microbolometer 312 is a specific type of bolometer, an electrical instrument for measuring radiant energy, that is suitable for use as a detector in thermal cameras. In a typical microbolometer, infrared radiation with wavelengths between 7.5-14 µm strikes a detector material, heating it. This change in temperature changes the sensor's electrical resistance in a predictable fashion, allowing for the intensity of incident radiation in this range during a given time to be inferred based on the change in electrical resistance over this same period.

By incorporating microbolometers 312 into a digital pixel as a detector element, improvements in frame rate and image resolution can be achieved without a corresponding loss in FPA sensitivity, which would normally be expected where rolling subframe readout integration 200 techniques are used, as compared to continuous integration. This is because microbolometers 312 have the significant benefit of integrating IR radiation within their range of sensitivity without the use of further circuitry. This characteristic allows readout integration 200 (i.e. sampling of the microbolometer 312) to occur over a relatively short amount of time (e.g. fractions of a frame), with the remaining data being inferred based on the self-integration characteristics of the microbolometer 312.

Microbolometer 312 self-integration of photon flux incident thereon is a thermal integration that is due to the thermal mass of the detector itself. Specifically, the sensor temperature is measured at a first time, IR radiation is allowed to impact the detector, causing the temperature of the detector to rise, and, at a second time, the temperature is measured again (e.g. it is inferred by the predictable change in resistance of the microbolometer 312 over a given temperature range). Since the microbolometer 312 changes in temperature over the entire frame, measuring the resistance of each microbolometer 312 over very short timeframes and doing so multiple times per frame allows the photon flux incident on the detector between measurements to be inferred. The rate at which heat is conducted away from the microbolometer 312 is proportional to the time-constant of the detector.

By combining microbolometer 312 detectors, rolling subframe pulsed bias integration techniques, and two stage ADC techniques and associated circuitry, allows for many advantages. Advantages of this approach include a dynamic range limited only by the number of bits in a counter, not by process voltage range, allowing for counter rollover for automatic noiseless offset subtraction, and support for very fast frame rates, even for larger formats, due to the digital output from the pixel.

Figure 2A:
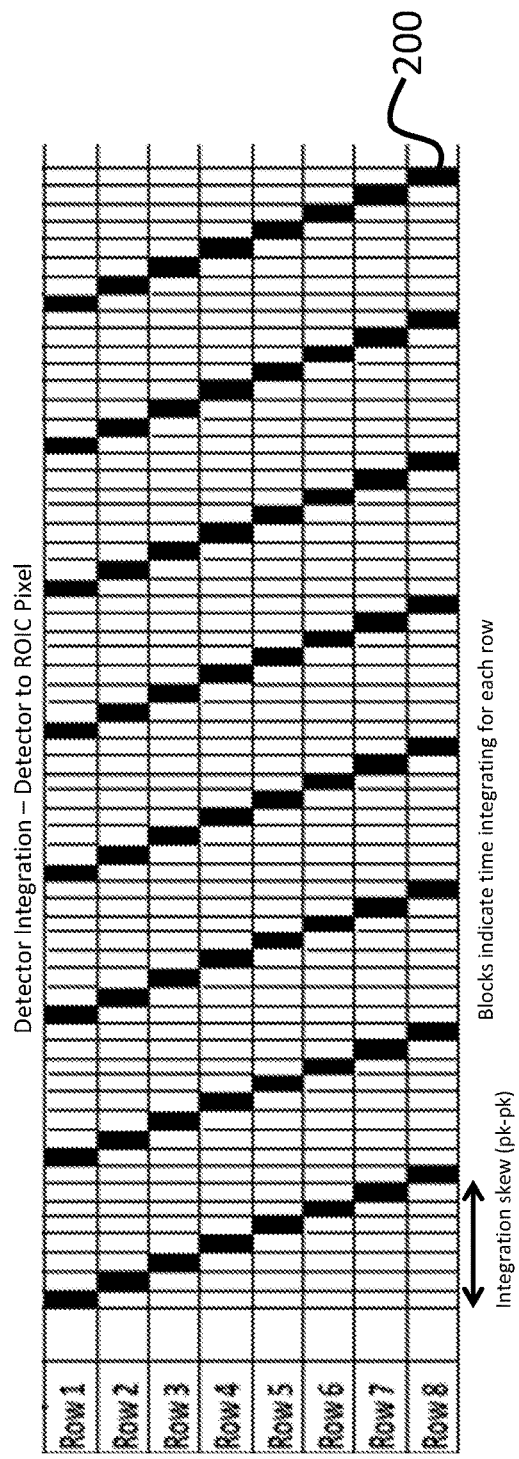
FIG. 2A is a chart describing a first half of a rolling subframe pulsed bias microbolometer integration scheme, in which the ROIC integrates the detector current, in accordance with embodiments of the present disclosure.

Now referring to FIG. 2A, a chart describing a first half of a frame that is readout and integrated using a rolling subframe pulsed bias microbolometer 312 integration scheme, in which an ROIC integrates the detector current, in accordance with embodiments of the present disclosure, is shown. In this figure, pixels are grouped into subsets, or rows, of 8, although embodiments may use more or fewer groupings without departing from the teachings of the present disclosure, dependent on the design goals. In the case of this exemplary embodiment, one microbolometer 312 from each group of 8 is integrated by the ROIC simultaneously, over a small fraction of the half of the frame dedicated to readout integration 200. After each pixel from a pixel group has been integrated by the ROIC, the process is repeated a number of times and the results of each integration summed to provide a total frame integration value. The precise number of pixels in a group and the number of subframes integrated and summed to provide a total frame integration value for a given pixel may vary, dependent on design goals and other considerations, and need not be the same. While this technique does not provide true snapshot integration, the integration skew, i.e. the time between beginning integration of a first pixel in a group of pixels and the beginning of integration of a last pixel in the same group of pixels, can be made a small fraction of the frame period, providing performance close to true snapshot integration without overburdening pixel and associated circuitry. Furthermore, since only 1 detector out of a group is ever integrating at one time, many components can be shared between pixels belonging to a given group.

Figure 2B:
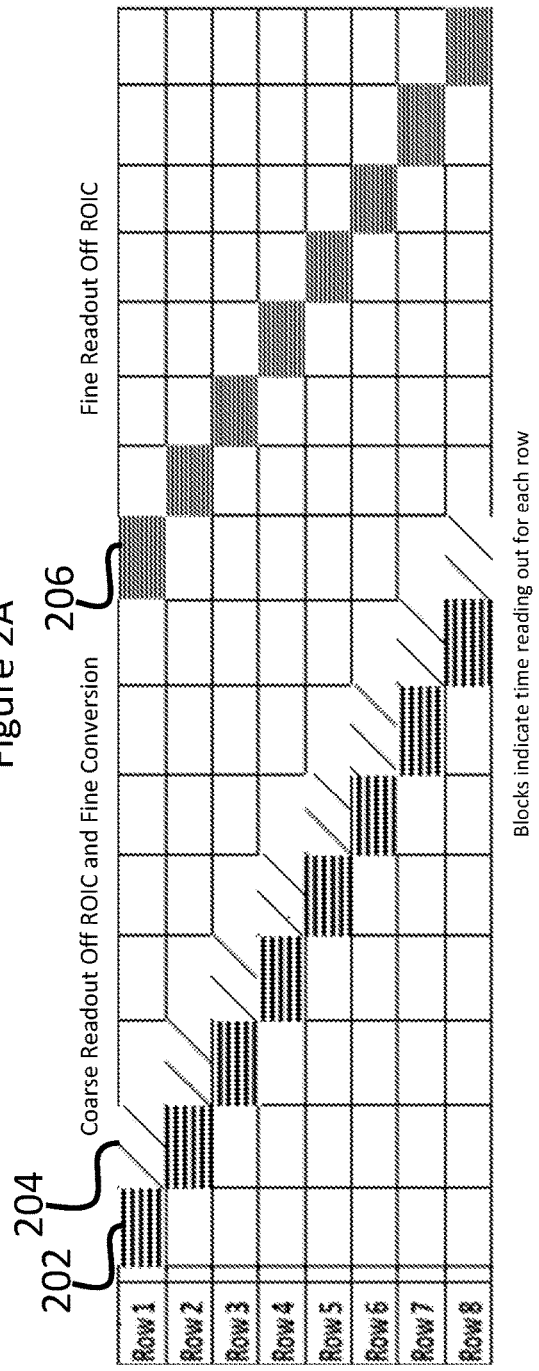
FIG. 2B is a chart describing a second half of a rolling subframe pulsed bias microbolometer integration scheme, in which integrated current is read off of a chip and fine conversion is performed, in accordance with embodiments of the present disclosure.

Now referring to FIG. 2B, FIG. 2B is a chart describing a second half of the rolling subframe pulsed bias microbolometer 312 integration scheme of FIG. 2A, in which integrated current is read off of the ROIC and, in embodiments implementing in-pixel two stage ADC, fine conversion 204 is performed, in accordance with embodiments of the present disclosure. FIG. 2B shows fine conversion 204 performed after readout of the coarse data 202 for each detector (in the exemplary embodiment depicted, in the group of 8 detectors). In embodiments that use the same memory for both conversions in the frame, which minimizes the amount of memory in the pixel, fine conversion 204 needs to take place after coarse readout 202, since it will rewrite the memory associated with each detector. Fine conversion 204 also requires a counter and so, if it is shared among the detectors (8, in the exemplary embodiment shown), as is the case in embodiments, the detectors (8, in the exemplary embodiment shown) need to take turns using it. Fine conversion 204 can take place any time between the readout of the coarse data 202 and the readout of the fine data 206 for a given detector. The order of readout and fine conversion 204 does not need to match the integration subframe order.

To summarize FIGS. 2A and 2B differently, instead of simultaneously integrating all detectors, perform a series of rolling subframe integrations, where each subframe is taken using only part of the array, and sum the subframes on the ROIC for each pixel. Because the subframes are spaced out across the integration time for all detectors, the integration skew across the FPA is small, effectively providing the benefits of true simultaneous integration. While providing results similar to those of true simultaneous integration, these techniques and methods result in lower FPA power requirements, easier bias requirements on ROIC, and lower detector impedance requirements, compared to true snapshot integration.

In one embodiment, where pixels are grouped into groups of eight (8), the half of the frame dedicated to detector integration is broken up into eight (8) subframes, and the frame rate is 120 Hz, integration skew is 456 µs, or 5% of the frame period, the total integration readout time is 521 µs and the individual pulse bias subframe times are 62 µs.

Figure 3:
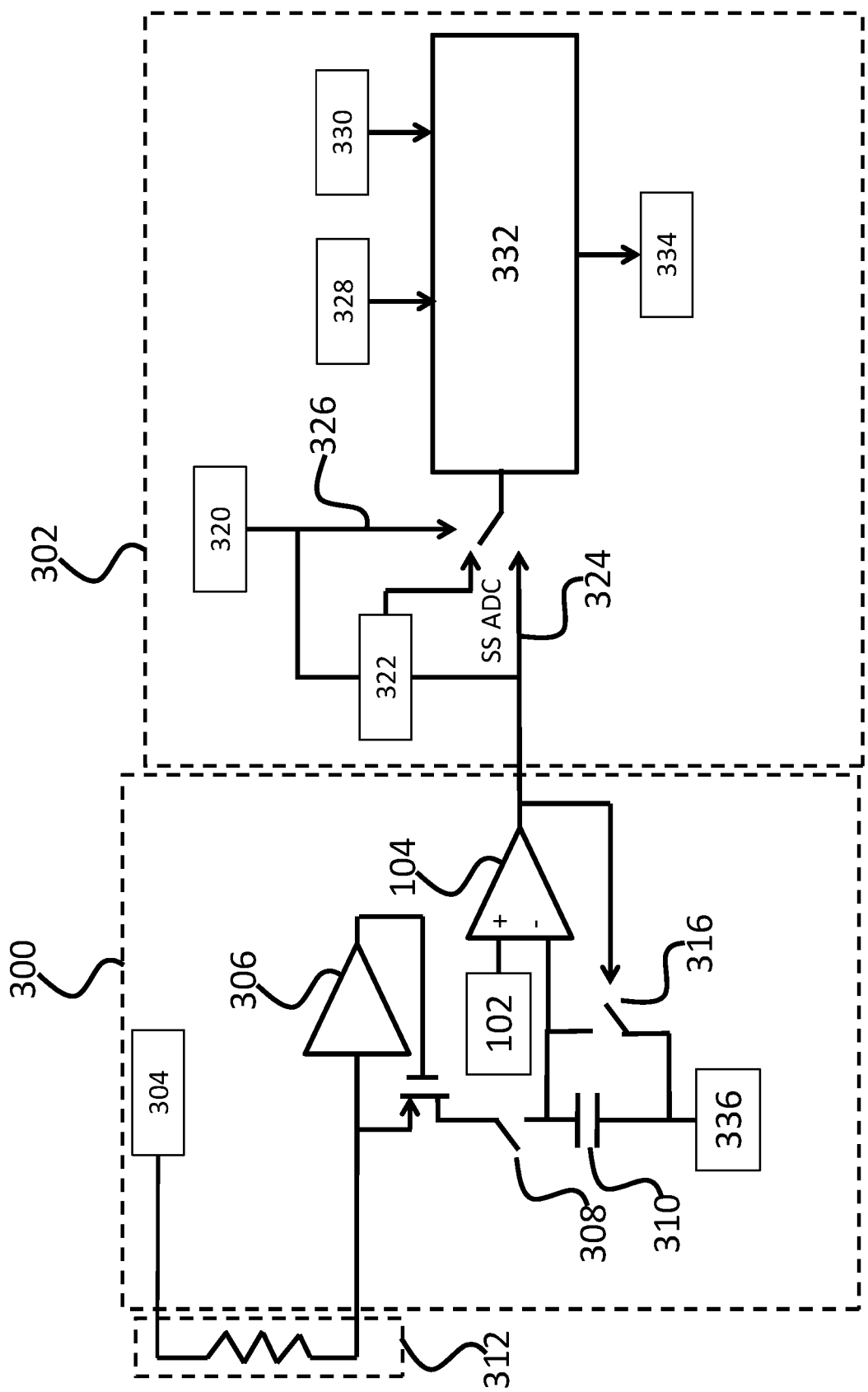
FIG. 3 is a schematic showing a digital IR pixel that uses a microbolometer as a detector with analog and digital portions thereof labeled, in accordance with embodiments of the present disclosure.

Now referring to FIG. 3, a schematic showing an ROIC that uses a microbolometer 312 as a detector with analog and digital portions thereof highlighted, in accordance with embodiments of the present disclosure, is shown. This embodiment shows an ROIC analog pixel 300 portion and an ROIC digital pixel 302 portion. The ROIC includes a microbolometer 312, a detector common 304, a BDI input with low noise bias amp 306, an integration stop switch 308, a readout integration 200 capacitor 310, a comparator 104 with threshold voltage input 102, a VRSI reference/ramp 336, an integration reset switch 316, a count reset connection 324, an enable count latch 322, a global clock 320, a readout connection 326, a data in bus 328, a count/shift bus 330, a counter/shift register 332, and a data out module 334.

Figure 4:
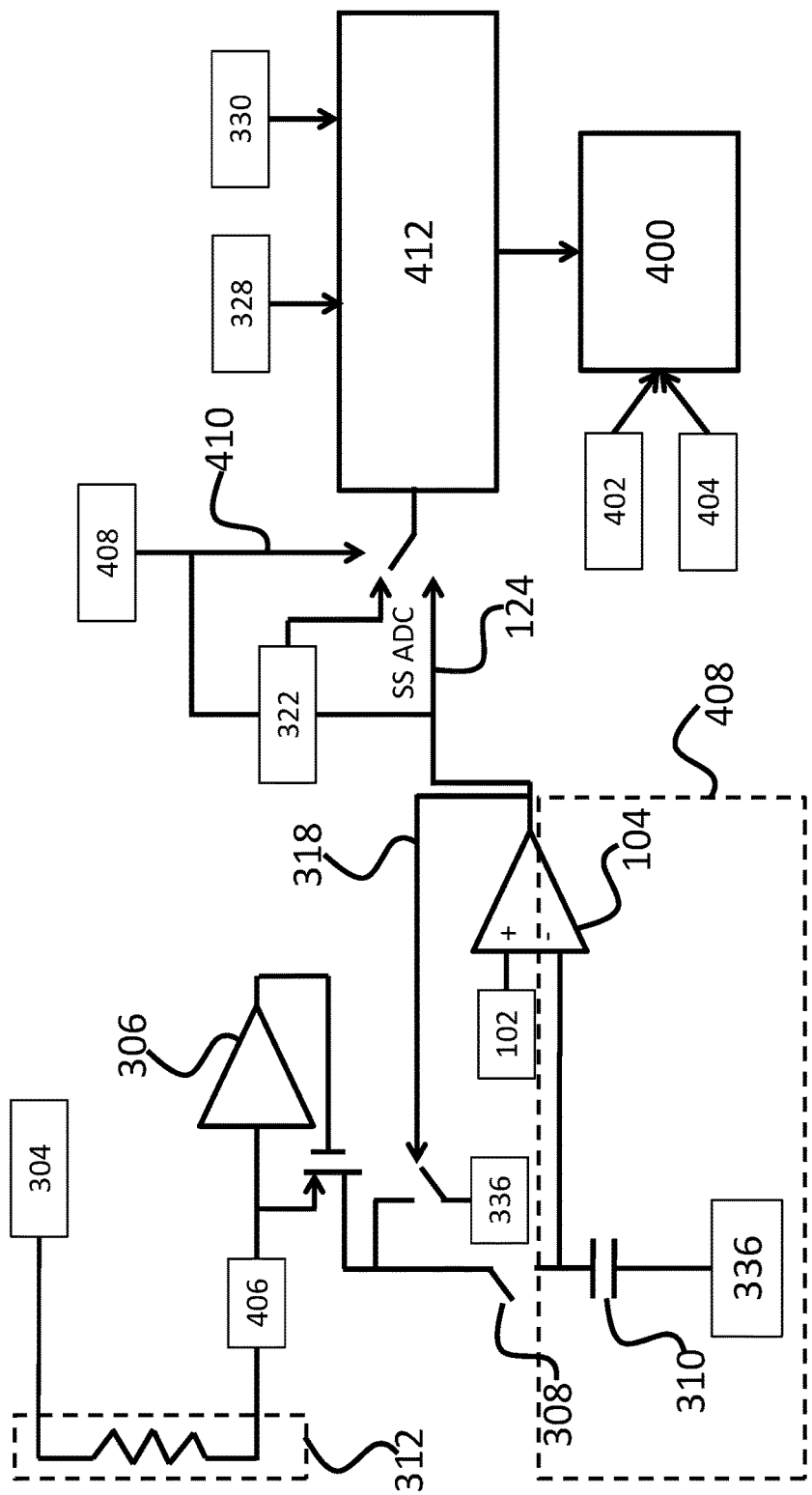
FIG. 4 is a schematic showing a digital IR pixel that uses a microbolometer as a detector that calls out portions of the circuitry required on each pixel, in accordance with embodiments of the present disclosure.

FIG. 4 discloses a variation on the ROIC of FIG. 3 that allows sharing of many components in the ROIC pixel between a group of detectors. In this embodiment, the readout connection 326 is replaced by a latch connection 410, and the counter/shift register 332 is replaced by a counter/latch 412, and the comparator 104 output is connected to VREF 336. Other differences include the connection of a latch module 400 having a select latch write 402 and select latch read 404 connected thereto to the counter/latch 412. The latch module allows one counter 412 to be shared among the group of detectors. The latch module contains latches with the same number of bits as the counter. The number of latches is equal to the number of shared detector pixels. In the exemplary embodiment discussed above, for example, there would be eight (8) 10-bit latches in the latch module.

The latch module saves coarse count data from other detectors' previous subframes while the current detector is using the counter to count in the current subframe. At the end of the subframe for each detector, the counter value is stored in a latch for that detector and the count data for the next detector from previous subframes is loaded into the counter to continue the integration for that detector in the next subframe. Since latches are simpler than counters, this minimizes the number of devices needed in the pixel. Compact Static random-access memory (SRAM) devices can be used for these latches that minimize layout area. Separate latches also allow coarse readout directly from the latches while the counter is used for fine conversion, so no separate time is needed for fine conversion beyond the normal readout time. This figure also includes the addition of a multiplexer 406 between the microbolometer 312 and bias amp 306, which is required in such embodiments for the sharing of circuits. Furthermore, this figure outlines the integration capacitor section of the circuit 408, which must be present for each pixel. Other components of the circuit that must be present in each pixel, i.e. they cannot be shared amongst pixels in a group of pixels, consist of the microbolometers 312 themselves, the latch module 400, comparator 104 inputs, which are part of the integration capacitance (although the comparator 104 itself can be shared), the integration stop switch 308, and the readout integration 200 capacitor 310. All other components may be shared in various embodiments.

Figure 5:
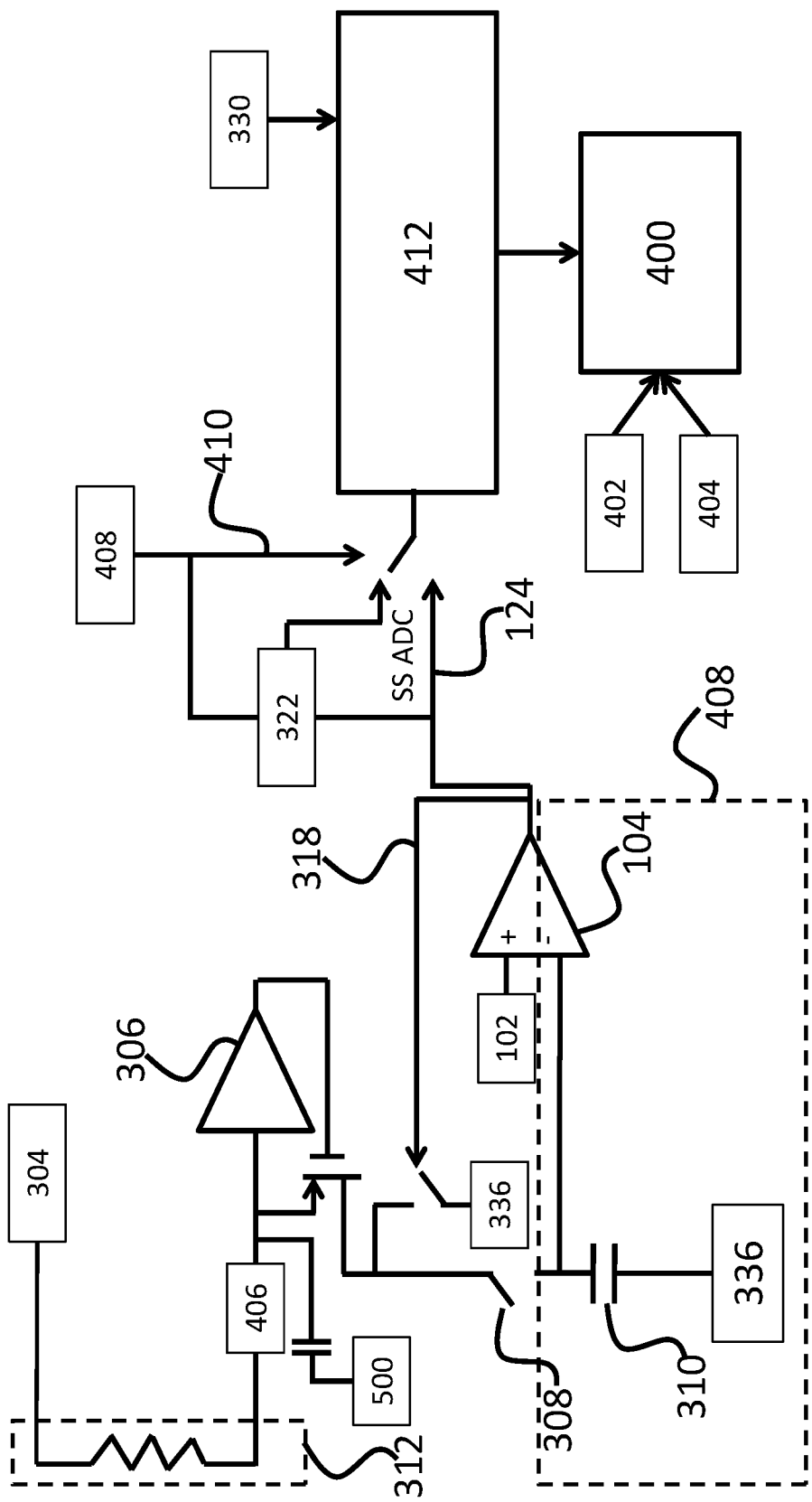
FIG. 5 is a schematic showing a digital IR pixel that uses a microbolometer as a detector that calls out portions of the circuitry required on each pixel and includes an additional fine conversion ramp, compared to the circuit shown in FIG. 4, in accordance with embodiments of the present disclosure.

Now referring to FIG. 5, FIG. 5 shows the circuit of FIG. 4 further comprising a fine conversion ramp 500. Multiple options exist for conversion of fine residue. In embodiments, single slope ADC is used, allowing the same counters to be used for coarse and fine conversion, assuming that they are done sequentially. This requires a conversion ramp in each pixel and would result in conversion being accomplished in a fixed time with fixed gain. FIGS. 3 and 4 supply the single slope conversion ramp using VREF 336, which is a DC voltage during integration and coarse conversion, but becomes a ramp for fine conversion. FIG. 5 introduces the ramp using a coupling capacitor connected to a voltage ramp input 500. This capacitor converts the voltage ramp into a constant current, which is integrated to fill the integration capacitor 310, tripping the comparator 104 to do the conversion. Such embodiments would require some calibration of at least offset, but integration time would be exact and conversion could be accomplished later.

In embodiments, a standard binary counter paired with latches may be used. In other embodiments, a charge pump "analog" Multi-Value Digital (MVD) counter could be used. Such an embodiment would support a die having a larger area, but would entail a considerably more complicated circuit and would likely slow readout.

In embodiments, an HDR pixel is used to perform subframe integration and summing of the microbolometer 312.

In embodiments, the digital pixel ROIC counts the number of well fills (coarse) and digitizes the residue at the end of integration (fine).

In embodiments, fine residue conversion uses single slope conversion in the pixel with the same comparator 104 and counter used for coarse conversion.

In embodiments, the coarse counter can roll over, thereby enhancing dynamic range.

Rolling subframe pulsed bias integration allows some variation in the FPA time constant for short time constants. If the detector time constant is less than the readout time, the readout time of the subframes can extend the time constant of the FPA beyond that of the detector, without having to increase the total readout integration time 200 per frame. Keeping total readout integration time 200 short can have advantages for microbolometer 312 sensitivity and power.

This is because microbolometer 312 sensitivity depends on the power input into the detector during readout, with a certain total energy level required for a specific performance level. Since shorter integration times have higher power per time and power is equal to $I^2R$, shorter integration times result in higher current, but only as the square root of the integration time. However, the time reduction is linear for less total electrons. A shorter integration time also has less total detector integrated current for the same sensitivity, for lower bias power and lower counting power. A higher current allows the use of a higher overall detector bias, reducing requirements on ROIC detector bias noise, which is a significant ROIC design driver. Higher bias current allows the use of a lower detector impedance while still providing a reasonable detector bias voltage, creating significant advantages to the detector and to the ROIC for shorter readout integration 200 times.

In conclusion, the advantages of the rolling subframe integration techniques disclosed herein include integration skew<1/#subframes, lower detector bias current, and power for the full array, compared to simultaneous integration, while also allowing for less total digital count power. Reduced current and power allows for more scalability to larger formats than full simultaneous integration. Higher bias current and shorter integration times have less total integrated charge for same read power and performance due to higher bias voltage. Higher bias current and voltage during integration is also less influenced by ROIC input noise and can be used to vary the scene integration time constant of FPA, provides the ability to sum multiple short time constant subframes to create a longer time constant frame, and allows the number of subframes to be varied to vary the time constant. Furthermore, if subframe interleaving is done on an individual row basis, then the disclosed systems and methods allow for the sharing of features among adjacent pixels, in some cases allowing for a larger fill factor.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An infrared imaging apparatus comprising:
a focal plane array, said focal plan array comprising:
a plurality of pixels, wherein said pixels are grouped into subsets containing equal numbers of pixels, each pixel comprising:
a microbolometer configured to receive electromagnetic energy; and
a readout integrated circuit (ROIC) wherein one microbolometer from each group is integrated by the ROIC simultaneously, and wherein the remaining microbolometers are integrated one at a time, simultaneously with those of all other groups of pixels and wherein the results of each integration is summed to provide a total frame integration value for each pixel and the integrated current is read off of the ROIC.

2. The infrared imaging apparatus of claim 1 wherein the ROIC of each pixel comprises a detector common, a BDI input with low noise bias amp, an integration stop switch, a readout integration capacitor, a comparator with threshold voltage input, a reference/ramp, an integration reset switch, a count reset connection, an enable count latch, a global clock, a readout connection, a data in bus, a count/shift bus, a counter/shift register, and a data out module.

3. The infrared imaging apparatus of claim 1 wherein said ROIC is configured to perform in-pixel single slope analog to digital conversion.

4. The infrared imaging apparatus of claim 1 wherein said ROIC is configured to perform in-pixel two-stage analog to digital conversion.

5. An infrared imaging apparatus comprising:
A focal plane array, said focal plane array comprising:
a plurality of groups of pixels;
wherein each pixel is grouped into subsets containing equal numbers of pixels, and wherein a group of pixels shares a plurality of components with other pixels in said group of pixels,
wherein each pixel comprises a microbolometer photodetector,
wherein each of said groups of pixels is configured to perform in-pixel analog to digital conversion of electromagnetic energy collected by said microbolometers within that group of pixels using a readout integrated circuit (ROIC) common to said group of pixels, and
wherein one microbolometer from each group is integrated by the ROIC simultaneously, and wherein the remaining microbolometers are integrated one at a time, simultaneously with those of all other groups of pixels, with the integration repeated until all the microbolometers for each pixel have been integrated by the ROIC, and wherein the results of each integration is summed to provide a total frame integration value for each pixel and the integrated current is read off the ROIC.

6. The infrared imaging apparatus of claim 5 wherein the ROIC common to each grouping of pixels comprises a detector common, a BDI input with low noise bias amp, an integration stop switch, a readout integration capacitor, a comparator with threshold voltage input, a reference/ramp, an integration reset switch, a count reset connection, an enable count latch, a global clock, a latch connection, a data in bus, a count/shift bus, a charge pump analog multi-value digital counter, and a data out module.

7. The infrared imaging apparatus of claim 5 wherein the ROIC common to each grouping of pixels comprises a detector common, a BDI input with low noise bias amp, an integration stop switch, a readout integration capacitor, a comparator with threshold voltage input, a reference/ramp, an integration reset switch, a count reset connection, an enable count latch, a global clock, a latch connection, a data in bus, a count/shift bus, a counter/latch, and a data out module.

8. The infrared imaging apparatus of claim 7 further comprising a latch module comprising a select latch write and select latch read, wherein said latch module is in operative communication with said counter/latch.

9. The infrared imaging apparatus of claim 8 further comprising a multiplexer disposed between said microbolometer and said bias amp.

10. The infrared imaging apparatus of claim 9 wherein said ROIC is configured to perform in-pixel single slope ADC.

11. The infrared imaging apparatus of claim 9 wherein said ROIC is configured to perform in-pixel two-stage ADC.

12. A rolling subframe pulse bias integration method comprising:
    on a focal plane array comprising a plurality of pixels, wherein said pixels are grouped into subsets containing equal numbers of pixels, each pixel comprising a microbolometer photodetector:
    using a readout integrated circuit (ROIC), integrating one microbolometer from each group of pixels simultaneously;
    integrating the remaining microbolometers in each group, one at a time, simultaneously with those of all other groups of pixels;
    summing the results of each integration, thereby providing a total frame integration value for each pixel; and
    reading the integrated current off of the ROIC.

13. The method of claim 12 wherein reading the integrated current off of the ROIC comprises:
    reading out of coarse data off of the ROIC; and
    performing fine conversion of the coarse data.

14. The method of claim 13 further comprising, after performing fine conversion of the coarse data, reading out of said fine data off of the ROIC.

15. The method of claim 12 further comprising repeating the integration of said pixels a plurality of times after each pixel from a group of pixels has been integrated.

16. The method of claim 12 wherein integration of one microbolometer from each group of pixels occurs over a small fraction of a portion of a frame dedicated to readout integration.

* * * * *